(12) United States Patent  
Oakley et al.

(10) Patent No.: US 7,679,273 B2
(45) Date of Patent: Mar. 16, 2010

(54) STRAIN TOLERANT METAL ELECTRODE DESIGN

(75) Inventors: Charles D. Oakley, Davison, MI (US); Rick D. Kerr, Fenton, MI (US); Russel H. Bosch, Gaines, MI (US)

(73) Assignee: Delphi Technologies, Inc., Troy, MI (US)

( * ) Notice: Subject to any disclaimer, the term of this patent is extended or adjusted under 35 U.S.C. 154(b) by 736 days.

(21) Appl. No.: 11/496,189

(22) Filed: Jul. 31, 2006

(65) Prior Publication Data

US 2008/0024043 A1    Jan. 31, 2008

(51) Int. Cl.
*H01L 41/047* (2006.01)

(52) U.S. Cl. .................. 310/365; 310/363; 310/364; 310/366; 310/328; 29/25.35

(58) Field of Classification Search .............. 310/328, 310/363–366; 29/25.35
See application file for complete search history.

(56) References Cited

U.S. PATENT DOCUMENTS

| | | | | |
|---|---|---|---|---|
| 5,252,883 A * | 10/1993 | Kondo | .......................... | 310/328 |
| 6,208,026 B1 | 3/2001 | Bindig et al. | ................ | 257/718 |
| 6,307,306 B1 | 10/2001 | Bast et al. | ................... | 310/366 |
| 6,411,018 B1 * | 6/2002 | Heinz | .......................... | 310/363 |
| 6,452,308 B1 | 9/2002 | Heinz et al. | ................... | 310/328 |
| 6,452,312 B1 | 9/2002 | Hanaki et al. | ................ | 310/364 |
| 6,462,464 B2 | 10/2002 | Mitarai et al. | ................ | 310/366 |
| 6,464,149 B1 | 10/2002 | Hardy et al. | ............. | 239/102.2 |
| 6,507,140 B1 | 1/2003 | Heinz et al. | ................... | 310/366 |
| 6,522,052 B2 | 2/2003 | Kihara et al. | ................ | 310/366 |
| 6,563,687 B2 | 5/2003 | Kawazoe et al. | ......... | 361/301.4 |
| 6,794,800 B1 | 9/2004 | Heinz | .......................... | 310/366 |
| 6,940,213 B1 | 9/2005 | Heinz et al. | ................... | 310/366 |
| 7,385,337 B2 * | 6/2008 | Mochizuki et al. | .......... | 310/365 |
| 7,429,817 B2 * | 9/2008 | Asano et al. | ................. | 310/364 |
| 7,439,655 B2 * | 10/2008 | Asano et al. | ................. | 310/328 |
| 2002/0043901 A1 * | 4/2002 | Kihara et al. | ................ | 310/366 |
| 2002/0158552 A1 | 10/2002 | Nakamura et al. | .......... | 310/328 |
| 2006/0055288 A1 * | 3/2006 | Heinzmann et al. | ......... | 310/364 |
| 2006/0232172 A1 * | 10/2006 | Asano et al. | ................. | 310/366 |

FOREIGN PATENT DOCUMENTS

WO    WO 03105246 A2 *  12/2003

* cited by examiner

*Primary Examiner*—J. SanMartin
(74) *Attorney, Agent, or Firm*—Thomas N. Twomey

(57) ABSTRACT

Exemplary embodiments of the present invention are related to an apparatus and method for providing a strain tolerant electrode, comprising: an upper layer; a lower layer; with the potential for a plurality of compliant members providing electrical communication between the upper layer and the lower layer; and wherein a surface of the upper layer is in direct contact with a surface of the lower layer to provide an electrical path between the upper layer and the lower layer.

24 Claims, 6 Drawing Sheets

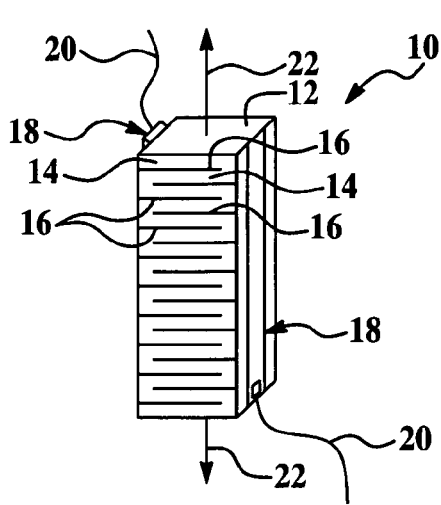
Figure 1
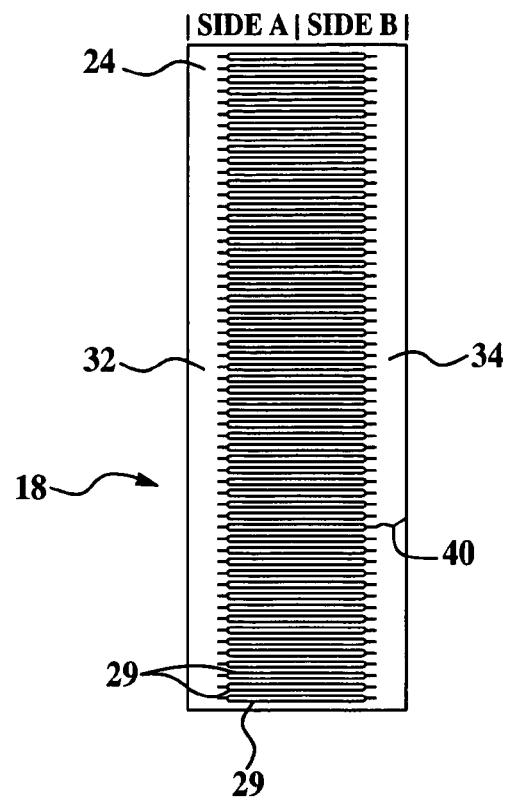
Figure 2
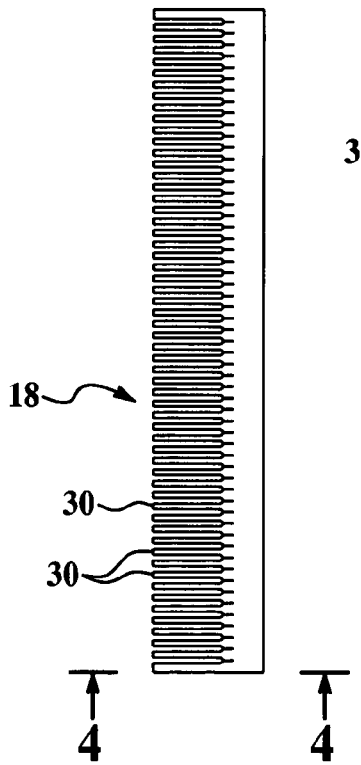
Figure 3
Figure 4
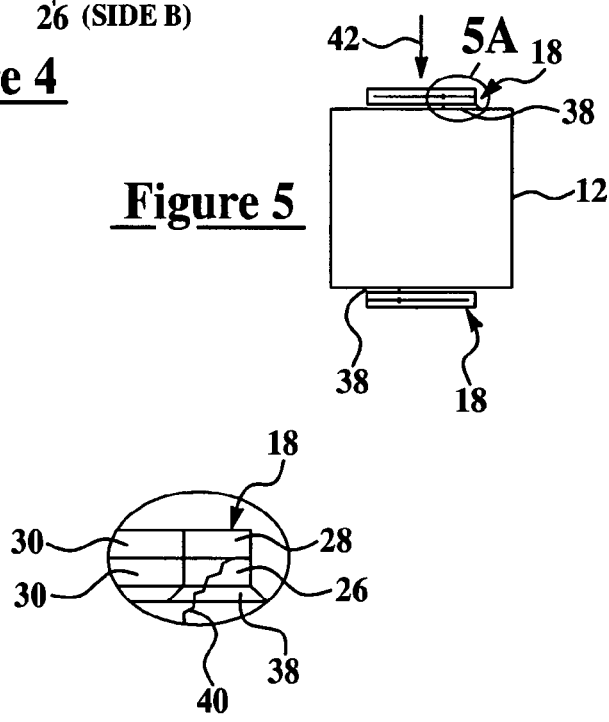
Figure 5
Figure 5A

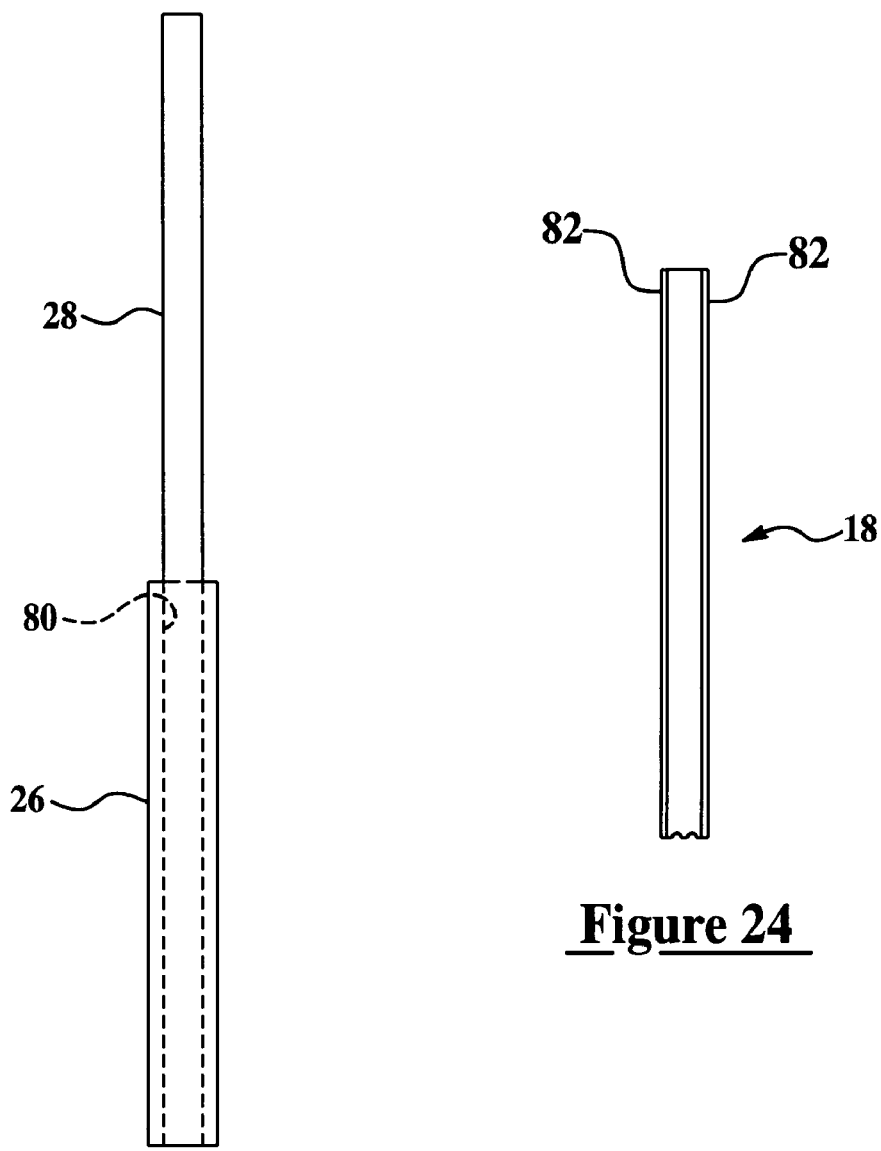
Figure 24
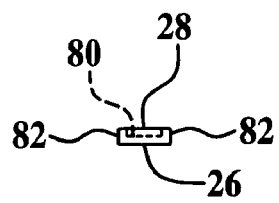
Figure 23
Figure 25
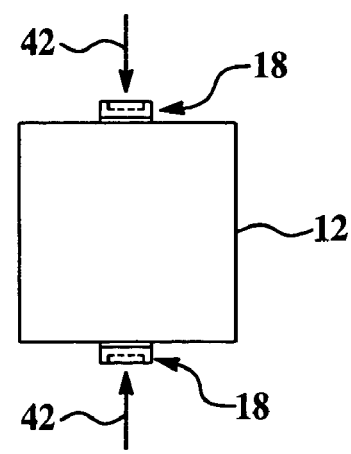
Figure 26

STRAIN TOLERANT METAL ELECTRODE DESIGN

TECHNICAL FIELD

The present invention relates to piezoelectric actuators. More particularly, the present invention relates to electrodes for piezoelectric actuators.

BACKGROUND

A piezoelectric actuator comprises a stack of laminated sheets or layers of piezoelectric ceramic elements. The piezoelectric ceramic elements or electrode thereof are arranged in an alternating fashion wherein alternating electrode portions are disposed at either side of the stack. In order to actuate the stack of piezoelectric material, electrical energy is distributed within the stack via a common electrode for each polarity. A stack of piezoelectric material has many internal electrode layers of alternating polarity. These alternating layers require a reliable electrical connection to a common electrode electrically terminated therewith. The common electrode, one on each side of the stack, will distribute the voltage in order to actuate the stack.

During stack actuation, the stack itself will expand and contract thus, piezoelectric actuators are used for actuating control valves or fuel injection valves in vehicles as they can be designed to provide precise ranges of actuation when subject to an actuating voltage. Accordingly, the common electrodes disposed at either side of the stack must be capable of many cycles of elastic elongation and contraction without breaking the electrical connection.

Conductive polymers or metal electrodes that have complex multiple connections to the stack, are currently used for the common electrode function. The polymers have elastic properties that allow the electrodes to move with the piezoelectric, material at high cycle rates with strains of approximately 0.15%. Suitable conductive polymers have metal particles that randomly touch each other to allow for electrical current flow. However, and due to the usage of metal particles, the conductive polymers will have lower conductance per unit area than wrought metal electrodes. Accordingly, connection points or small section areas can result in localized overheating because of the limited number of metal particles contacting each other. In contrast, wrought metal electrodes are generally excellent conductors as they can be connected with low contact resistance using common connection technologies like soldering or spot welding. They also have properties that excel at the high frequency or current changes that are used in piezoelectric stacks. In addition, these metal electrodes produce a minimum resistance heating at operating conditions typically encountered by piezoelectric stacks.

However, the major drawbacks for using wrought metal side electrodes in piezoelectric actuators can be twofold: i) simple designs are not able to handle the cyclic strain of stack actuation without cracking, and ii) complex designs can handle the strain, but have multiple attachment points and/or surfaces bonded to the stack.

Therefore, it is desirable to provide a simplified strain tolerant metal side electrode with a single attachment surface for use with a piezoelectric actuator.

SUMMARY

Exemplary embodiments of the present invention are related to an apparatus and methods for fabrication of a strain tolerant electrode, comprising: an upper layer; a lower layer; a plurality of compliant members providing electrical communication between the upper layer and the lower layer; and wherein a surface of the upper layer can also be in direct contact with a surface of the lower layer to provide an electrical path between the upper layer and the lower layer.

In another embodiment a strain tolerant electrode is provided. The strain tolerant electrode comprising: an upper layer; a lower layer; a single compliant member that can crack in-service and become multiple compliant members, providing electrical communication between the upper layer and the lower layer; and wherein the inside surface of the upper layer can also be in direct contact with the un-bonded surface of the lower layer to provide a secondary electrical path between the upper layer and the lower layer.

In yet another exemplary embodiment of the present invention a method for manufacturing a strain tolerant electrode is disclosed. The method of manufacturing the strain tolerant electrode comprising: cutting a plurality of slots within a sheet of conductive material; folding the sheet of conductive material upon itself to define an upper layer and a lower layer, wherein the plurality of slots define a plurality of compliant members each of which providing electrical communication between the upper layer and the lower layer and wherein a surface of the upper layer is in direct contact with a surface of the lower layer after the sheet of conductive material is folded upon itself, wherein any cracks in the lower layer are bridged by the plurality of compliant members and/or the direct contact between the surface of the lower layer and the surface of the upper layer.

In yet another exemplary embodiment, a piezoelectric actuator with a strain tolerant electrode is provided. The piezoelectric actuator, comprising: a stack of piezoceramic layers; a plurality of internal metal electrodes, each having a lead extending out of the stack of piezoceramic layers in alternate directions on opposite sides of the stack of piezoceramic layers; a first external electrode electrically connected to the leads of the internal metal electrodes extending out of one side of the stack of piezoceramic layers; a second external electrode electrically connected to the leads of the internal metal electrodes extending out of another side of the stack of piezoceramic layers; wherein the first external electrode and the second external electrode each comprise: an upper layer; a lower layer; a plurality of compliant members providing electrical communication between the upper layer and the lower layer; and wherein the inside surface of the upper layer is in direct contact with the un-bonded surface of the lower layer to provide an electrical path between the upper layer and the lower layer.

In another embodiment a strain tolerant electrode is provided. The strain tolerant electrode comprising: an upper layer and a lower layer joined at one end of said electrode, so to provide interfacial contact and electrical communication between; the inside surface of the upper layer and the unbonded surface of the lower layer.

BRIEF DESCRIPTION OF THE DRAWINGS

FIG. 1 is a perspective view of piezoelectric actuator with strain tolerant electrodes constructed in accordance with an exemplary embodiment of the present invention;

FIGS. 2 and 3 are views of an electrode constructed in accordance with exemplary embodiments of the present invention;

FIG. 4 is a view along lines 4-4 of FIG. 3;

FIG. 5 is an end view of a piezoelectric actuator with a pair of electrodes constructed in accordance with exemplary embodiments of the present invention;

FIGS. 23-26 are view illustrating still another alternative exemplary embodiment of the present invention.

DETAILED DESCRIPTION OF EXEMPLARY EMBODIMENTS

Figure 6:
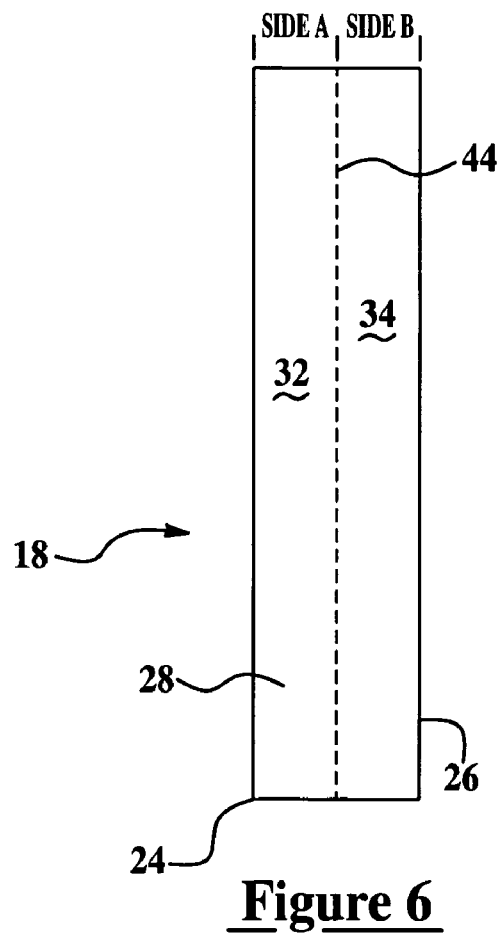
FIGS. 6 and 7 are views of an electrode constructed in accordance with an alternative exemplary embodiment of the present invention.

Referring now to FIG. 1 a multi-layer piezoelectric actuator 10 constructed in accordance with an exemplary embodiment of the present invention is illustrated. Piezoelectric actuator 10 comprises a stack 12 of sintered films of piezoceramic material or layers 14. Disposed therebetween are a plurality of inserted internal metal electrodes 16 each having leads extending out of the stack in alternate directions and are electrically connected in parallel to a pair of external electrodes 18. Although illustrated as having a rectangular configuration exemplary embodiments of the present invention are contemplated for use with a variety of actuator shapes (e.g., circular, square, triangular etc.), which may ultimately depend on the environment the actuators are used in. A non-limiting example of a piezoelectric stack and/or application thereof is found in U.S. Pat. Nos. 6,464,149 and 6,940,213, the contents each of which are incorporated herein by reference thereto.

Electrical conductors 20 are electrically terminated with the external electrodes. The electrical termination is provided by any suitable process, non-limiting examples include soldering, welding, etc. Upon the application of a voltage to the electrode, the stack expands in the direction of the arrows 22. If an alternating voltage of corresponding output is applied, the stack performs an expansion and contraction movement as dictated by the change in voltage.

After repeated expansion and contraction of the piezoelectric actuator, slight cracks will eventually occur in the ceramic material of the layers of the piezoelectric actuator. As discussed above, these cracks will pose problems, as they can also extend through the electrode fixedly secured to the side of the stack at the location where the crack surfaces. Therefore, some of the leads of the internal electrodes may no longer be supplied with a voltage as the termination with the electrode has been severed.

In accordance with an exemplary embodiment of the present invention a strain tolerant electrode is provided. The strain tolerant electrode of exemplary embodiments of the present invention will address drawbacks found with wrought metal electrodes and cracks formed due to the expansion and contraction of the piezoelectric actuator.

In accordance with exemplary embodiments of the present invention a layered electrode design is provided wherein a portion of a first portion or lower layer of the electrode is directly secured to the leads of the internal metal electrodes and the portion of the first portion or lower layer is allowed to crack during actuation of the piezoelectric stack. However, the electrical contact of each fractured segment on the stack is maintained through compliant connections with and/or a sliding contact with an intact common top electrode layer. In accordance with an exemplary embodiment, the top layer will not be subject to the cyclic strain of the bottom layer and therefore the top layer will not crack when the lower layer breaks.

Referring now to FIGS. 2-5, an exemplary embodiment of a strain tolerant electrode is illustrated. Here electrode 18 comprises a sheet of electrically conductive metal 24 (e.g., steel, copper, nickel, invar, alloys, etc. including clad combinations of same and equivalents thereof) wherein sheet 24 is folded upon itself to define a lower layer 26 and an upper layer 28. In one non-limiting example, the electrode is comprised of two layers formed by folding the metal sheet. In one non-limiting exemplary embodiment, the metal sheet is approximately 0.002 inches thick. In accordance with an exemplary embodiment, lower layer 26 is electrically terminated to the leads of the internal electrodes via a bonding process wherein lower layer 26 is secured thereto. In addition, sheet 24 is cut to have a plurality of openings or strain relief slots 29 to define a plurality of compliant members 30 when upper layer is folded upon the lower layer.

In one non-limiting exemplary embodiment the plurality of slots are formed in the sheet of conductive material by an electrical discharge machining process (EDM). Of course, any other suitable manufacturing process may be used to form the plurality of slots other non-limiting examples include, piercing, stamping, cutting, etc. and equivalents thereof.

In accordance with one exemplary embodiment, the openings defining complaint members 30 may be cut after the folding process, wherein the openings are cut into the folded longitudinal edge and extend inward about ⅔rds of the total electrode width of course, lengths greater or less than ⅔rds of the electrode width are contemplated to be within the scope of exemplary embodiments of the present invention. The cutting/forming of the compliant connections or members 30 can be done before or after the metal is folded to form the double thickness strip.

Accordingly, and when in the folded configuration illustrated in FIGS. 3-5 the upper layer is in electrical contact with the lower layer via the compliant members as well as by interfacial contact between the uncut surface 32 of upper layer 28 making contact with a second uncut surface 34 of lower layer 26.

As illustrated in FIG. 5, the lower layer of the metal side electrode is soldered or bonded to the metalized thick film area of the stack with as much bond strength as possible since exemplary embodiments will mitigate the deleterious effects of cracks caused by strong bonds between the lower layer and the stack. FIG. 5 illustrates a bonding material 38 disposed between the lower layer and the leads of the internal electrodes. A non-limiting example of the method used for bonding layer 38 is soldering, brazing, welding or the use of a conductive epoxy.

Figure 7:
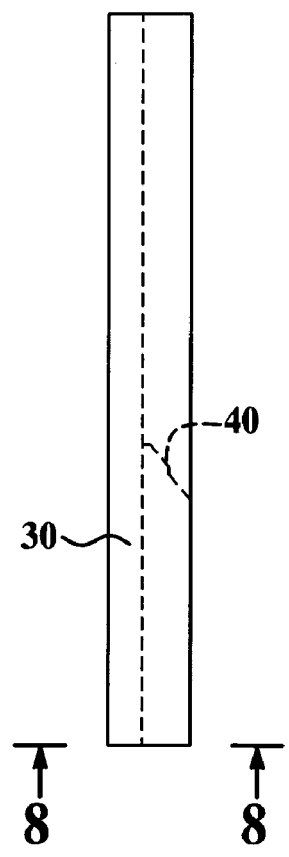
Figure 8:
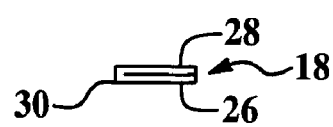
FIG. 8 is a view along lines 8-8 of FIG. 7.
Figure 9:
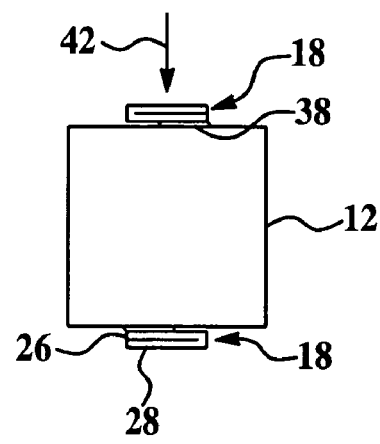
FIG. 9 is an end view of a piezoelectric actuator with a pair of electrodes constructed in accordance with the alternative exemplary embodiment of FIGS. 6-8.
Figure 10:
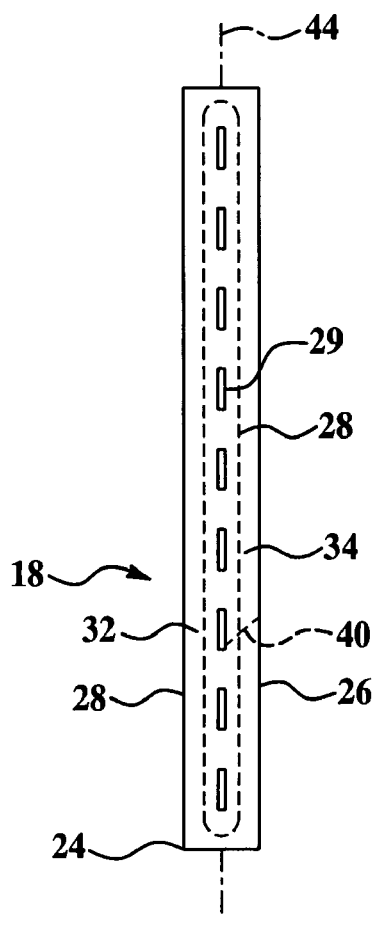
FIGS. 10 and 11 are views of an electrode constructed in accordance with another alternative exemplary embodiment of the present invention.
Figure 11:
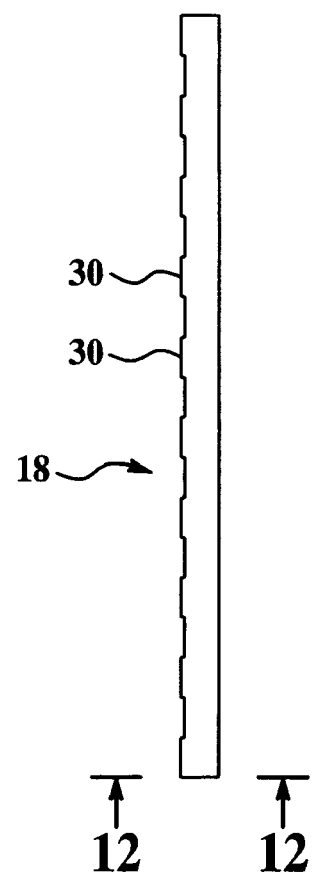
Figure 12:
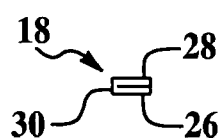
FIG. 12 is a view along lines 12-12 of FIG. 11.
Figure 13:
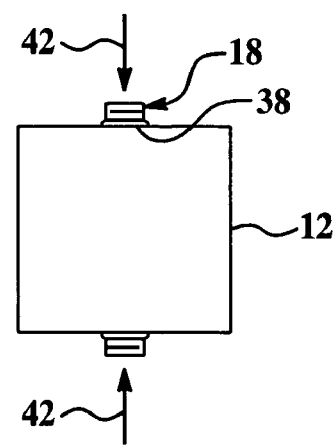
FIG. 13 is an end view of a piezoelectric actuator with a pair of electrodes constructed in accordance with the alternative exemplary embodiment of FIGS. 10-12.
Figure 14:
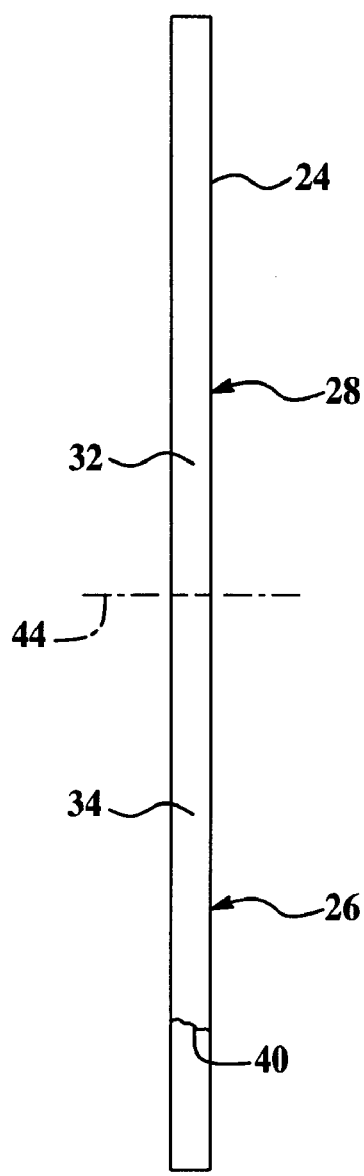
FIGS. 14 and 15 are views of an electrode constructed in accordance with another alternative exemplary embodiment of the present invention.
Figure 16:
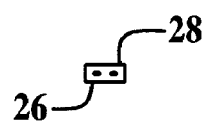
FIG. 16 is a view along lines 16-16 of FIG. 15.
Figure 15:
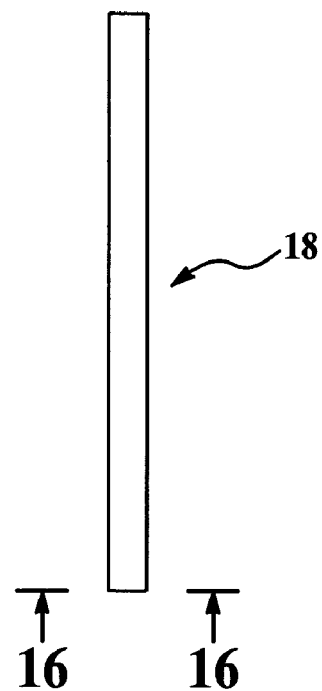
Figure 17:
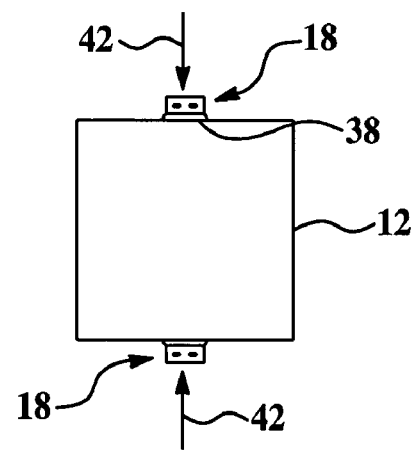
FIG. 17 is an end view of a piezoelectric actuator with a pair of electrodes constructed in accordance with the alternative exemplary embodiment of FIGS. 14-16.

As illustrated, the bottom layer is bonded to the stack of the metalized thick film area. As shown in FIGS. 2 and 5A, during repeated actuation of the device, a crack 40 will only travel through bottom layer 26. However, and in accordance with an exemplary embodiment the top layer 28 in FIGS. 4 and 5A, will not crack because it is only connected to the lower layer via the highly compliant metal segments or compliant members 30. Freedom of movement of the upper layer with respect to the lower layer is also provided, as there is no direct bonding between surface 32 and 34 although an electric path is possible between the two surfaces with direct contact between the two layers. Accordingly, no cracking of the upper layer will occur as the segments or complaint members 30 are not bonded to the stack. Accordingly, any crack in the bottom layer will be electrically bridged by the top layer which is mechanically/electrically connected to it through the compliant segments as well as when surface 32 is making contact with surface 34. This design or embodiment of FIGS. 2-5 is appropriate for a side electrode 18 that will not experience significant normal compressive loads in the direction of arrow 42 on the freely moving upper surface 28 and the complaint members 30. An example of environments providing forces in the direction of arrow 42 would be usage of the actuator in a vessel comprising high hydrostatic pressures. FIGS. 6-17 and 23-26 illustrate designs contemplated for use in environments wherein hydrostatic pressures or normal compressive loads are provided in the direction of arrow 42 on the freely moving upper surface.

Referring now to FIGS. 6-9, another alternative exemplary embodiment of the present invention is illustrated. Here electrode 18 is formed by folding the sheet of electrically conductive material 24 upon itself along a line 44 to create an upper layer 28 and a lower layer 26 and a single compliant member 30 is provided. Single compliant member 30 traverses the entire length of the electrode, wherein the lower layer and not the compliant member is bonded to the actuator. With cyclic strain a resulting crack 40 will pass through layer 26 and extend into section 30, creating multiple compliant metal electrical connections that maintain electrical communication between the cracked segments in layers 26 and the un-cracked top layer 28. Freedom of movement for the upper layer with respect to the lower layer is also provided as there is no direct bonding between surface 28 and 26. A redundant electric path is possible between surface 28 and 26 when there is direct contact between the two layers that will also electrically bridge cracks formed in layer 26.

In accordance with an exemplary embodiment, this design is suitable for use in environments when normal compressive loads are present on the upper layer in the direction of arrow 42 during application of strain tolerant electrode 18.

Referring now to FIGS. 10-13, another alternative exemplary embodiment of the present invention is illustrated. Here electrode 18 is formed by folding the sheet of electrically conductive material 24 upon itself along line 44 to create an upper layer 28 and a lower layer 26, wherein the lower layer is bonded to the actuator. As in the previous embodiments, any resulting crack 40 (illustrated in FIG. 10 via dashed lines) will pass through layer 26 while electrical connection remains across the leads of the internal electrode as complaint sections 30 (which can crack and maintain continuity) and surface 32 and 34 will continue to provided electrical connection between layer 26 and 28.

In accordance with this embodiment, the upper and lower layers are connected to each other via segments 30 formed by slots or openings 29 cut into the sheet of electrode material. In this embodiment, the slots or openings have a longer length along line 44 as opposed to the openings of the embodiment illustrated in FIGS. 2-5. As in the previous embodiments only one side of the bottom strip 26 is bonded to stack and the top strip 28 is relatively free and pressed against the bonded strip. Accordingly, the top strip can physically and electrically bridge any cracking in the bottom layer or strip because of interfacial contact pressure between the two layers (e.g., surfaces 32 and 34). During operation, the bottom layer will move with the stack during actuation, while the top layer will experience less motion. In addition, friction at the interface between surfaces 32 and 34 can be reduced by disposing a dry conductive lubricant (e.g., graphite) between the surface areas of the opposing faces of the upper and lower layers. Alternatively, the electrode material selection may assist in reducing this friction or the combination of the electrode material selection and the conductive lubricant will reduce the friction.

In yet another alternative exemplary embodiment, the folded common electrode could be formed from a flat strip with a continuous slot 29 cut in the middle of the sheet of the electrode material. This is illustrated by the dashed lines in FIG. 10 in this embodiment, the strip would be folded at the slot with a pair of tabs or compliant members disposed at the ends of the electrode and the slot in order to keep the strip layers in location for bonding of the lower layer. This design is also more tolerant for compressive loads applied to the upper layer of the electrode in the direction of arrow 42.

Referring now to FIGS. 14-17, yet another alternative exemplary embodiment of the present invention is illustrated. Here electrode 18 is formed by folding the sheet of electrically conductive material 24 upon itself along line 44 to create an upper layer 28 and a lower layer 26, wherein line 44 traverses the shorter width of the electrically conductive surface. Again, and as in the previous embodiments, the lower layer is bonded to the actuator and any resulting crack 40 will pass only through layer 26 while electrical connection remains across the surfaces 32 and 34 will continue to provide electrical connection between layers 26 and 28. Here the compliant section is formed at one end of the electrode corresponding to the shortest width of the electrically conductive material and the opposite end of layer 26 and 28 are not fixed to each other.

Even with multiple cracks in the bottom layer electrical contact will be maintained at the sliding interface between the two layers. In this embodiment, attachment between the layers would only be at the end of the electrode with the least amount of exposure to stress and strain. Moreover, the same location may be used for the terminal connection to the electrode. This design is particularly suitable for extreme compressive loads on the side electrode (e.g., loads in the direction of arrow 42).

Figure 18:
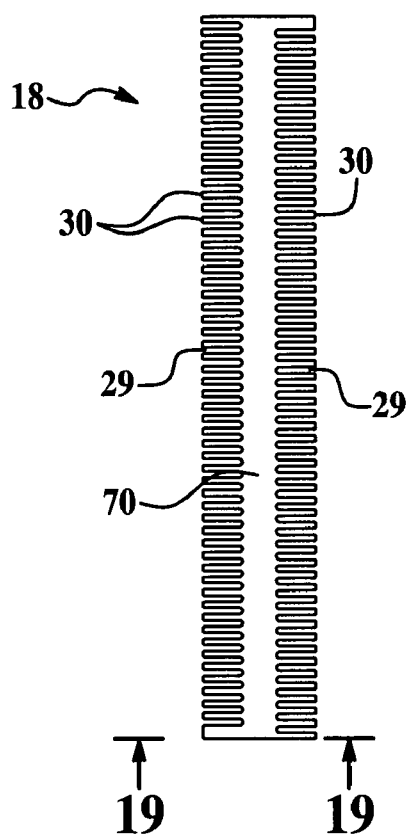
FIGS. 18-22 are views illustrating another alternative exemplary embodiment of the present invention.
Figure 20:
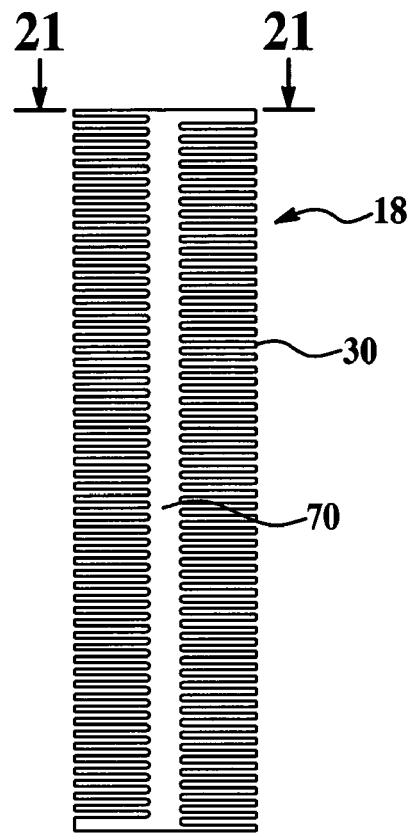
Figure 19:
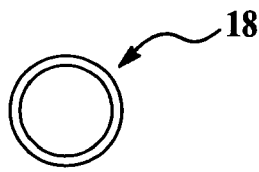
Figure 21:
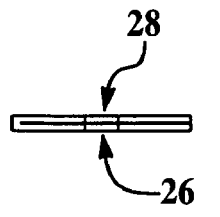
Figure 22:
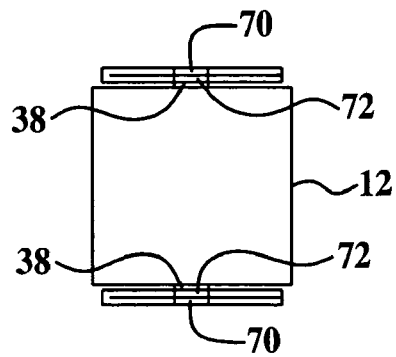

Referring now to FIGS. 18-22, another alternative exemplary embodiment of the present invention is illustrated. Here the electrode 18 is configured to have a plurality of compliant members 30 disposed along the exterior edges of the upper and lower layers and the upper and lower layers are each configured to have a centrally located strip 70, 72. In this embodiment, the sheet of electrically conductive metal is formed into a cylindrical shape (FIGS. 18 and 19) before the cutting or forming of the relief slots 29 in the exterior edges of the electrically conductive metal. Thereafter, the cylinder is flattened out and the width of the complaint members is extended as upper layer 28 is pushed towards lower layer 26. As in the previous embodiments, only the lower layer is bonded to the stack while the upper layer is free to move with respect to the lower layer and the plurality of complaint members provide a conductive path between the upper and lower layers.

In addition, and in accordance with an exemplary embodiment the complaint members are configured to have an alternating arrangement with respect to each other. Accordingly, staggered compliant members are provided on both sides of the upper and lower solid strip electrodes and the metalized surface on the stack that is bonded to the piezoelectric stack, is centered as opposed to the off-center placement illustrated in FIGS. 2-5. In addition, the bonding of this side electrode to the internal electrodes in the stack is also limited to the bottom strip, wherein cracking and segmentation of the electrode is expected. The increased number and staggered placement of the compliant members, decreases the probability that multiple transverse cracks in the lower electrode strip could electrically isolate a compliant member from a particular lower electrode segment. The compliant members also physically and electrically bridge the cracked segments of the bottom electrode to the upper strip. The top electrode strip acts as an electrical buss that is decoupled by the compliant members from the cyclic strain caused during actuation of the piezoelectric stack.

Referring now to FIGS. 23-26, another alternative exemplary embodiment of the present invention is illustrated. Here the electrode 18 is configured to have a larger lower layer with a "U" shaped opening or channel 80 disposed therein. Upper layer 28 is configured to have a smaller width than that of lower layer 26 and upper layer 28 is configured to be received within opening 80 as upper layer 28 is folded over and into lower layer 26. "U" shaped opening or channel 80 will also have a pair of sidewalls 82 extending along the length of opening 80.

In this embodiment, the sidewalls will guide and maintain alignment of the top electrode strip movement (e.g., layer 28) with the bottom electrode (e.g., layer 26) during actuation of the piezoelectric stack. The top electrode strip acts as a stationary buss and the bottom electrode strip moves with the stack and can crack transversely as a result. This design is particularly suitable for extreme compressive loads on the side electrode (e.g., loads in the direction of arrow 42).

An additional advantage of this arrangement is that the electrodes are self-aligning during assembly (e.g., folding over of layer 28 into opening 80) and actuation (e.g., cyclical movement of layer 26 but not layer 28). Moreover, full electrical contact between upper layer 28 and lower layer 26 is maintained during the lifetime of the stack, this is provided by the three surfaces (bottom and side walls) of U shaped opening 80. This will provide some additional advantage to the durability of the piezoelectric stack itself, in that stack cracking can promote stack misalignment with eventual failure of internal electrodes that are not capable of allowing for the cyclical strain.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the present application.

What is claimed is:

1. A strain tolerant electrode, comprising:
    an upper layer;
    a lower layer underlying the upper layer and configured for making bonded electrical contact with a stack of piezoceramic layers, wherein the upper layer and the lower layer are regions of a sheet of conductive material;
    a plurality of transverse compliant members providing electrical communication between the upper layer and the lower layer; and
    wherein a surface of the upper layer is in direct interfacial electrical contact with a surface of the lower layer to provide an electrical path between the upper layer and the lower layer and allow for actuator expansion and contraction of the lower layer without resulting expansion and contraction of the upper layer.

2. The strain tolerant electrode as in claim 1, wherein the strain tolerant electrode is formed by cutting a plurality of openings in the sheet of conductive material and folding the sheet of conductive material so that a first portion of the plurality of openings overlies a second portion of the plurality of openings.

3. The strain tolerant electrode as in claim 2, wherein the upper layer and the lower layer are defined by portions of the sheet of conductive material disposed about opposite sides of the plurality of openings.

4. The strain tolerant electrode as in claim 3, wherein the plurality of transverse compliant members are defined by the plurality of openings.

5. The strain tolerant electrode as in claim 1, wherein the strain tolerant electrode is formed from the sheet of conductive material and the plurality of complaint members are defined by a plurality of openings along a center line of the sheet of conductive material, wherein the plurality of openings are spaced apart from each other along the center line wherein a portion of each of the plurality of openings is located on one side of the center line and another portion of each of the plurality of openings is located on the other side of the center line.

6. The strain tolerant electrode as in claim 5, wherein the upper layer and the lower layer are defined by portions of the sheet of conductive material stacked to one side of the plurality of openings.

7. The strain tolerant electrode as in claim 6, wherein the plurality of transverse compliant members are defined by the plurality of openings.

8. The strain tolerant electrode as in claim 1, wherein the strain tolerant electrode is formed by cutting a plurality of openings in the sheet of conductive material, wherein the sheet of conductive material is rectangular in shape and the plurality of openings are substantially parallel to a width of the sheet of conductive material.

9. The strain tolerant electrode as in claim 8, wherein the width of the sheet of conductive material is substantially shorter than a length of the sheet of the conductive material.

10. A strain tolerant electrode, comprising:
    an upper layer;
    a lower layer underlying the upper layer and configured for making bonded electrical contact with a stack of piezoceramic layers, wherein the upper layer and the lower layer are regions of a sheet of conductive material;
    a single compliant member at one end providing electrical communication between the upper layer and the lower layer; and
    wherein a surface of the upper layer is in direct interfacial electrical contact with a surface of the lower layer to provide an electrical path between the upper layer and the lower layer.

11. A piezoelectric actuator, comprising:
    a stack of piezoceramic layers;
    a plurality of internal metal electrodes, each having a lead extending out of the stack of piezoceramic layers in alternate directions on opposite sides of the stack of piezoceramic layers;

a first external electrode electrically connected to the leads of the internal metal electrodes extending out of one side of the stack of piezoceramic layers;

a second external electrode electrically connected to the leads of the internal metal electrodes extending out of another side of the stack of piezoceramic layers;

wherein the first external electrode and the second external electrode each comprise:

an upper layer;

a lower layer underlying the upper layer and configured for making bonded electrical contact with a stack of piezoceramic layers, wherein the upper layer and the lower layer are regions of a sheet of conductive material;

a plurality of transverse compliant members providing electrical communication between the upper layer and the lower layer; and wherein a surface of the upper layer is in direct interfacial electrical contact with a surface of the lower layer to provide an electrical path between the upper layer and the lower layer and allow for expansion and contraction of the lower layer without resulting expansion and contraction of the upper layer.

12. The piezoelectric actuator as in claim 11, wherein the first and second external electrodes are formed by cutting a plurality of openings in the sheet of conductive material and folding the sheet of conductive material so that a first portion of the plurality of openings overlies a second portion of the plurality of openings.

13. The piezoelectric actuator as in claim 12, wherein the upper layer and the lower layer of the first and second external electrodes are defined by portions of the conductive material disposed about opposite sides of the plurality of openings.

14. The piezoelectric actuator as in claim 13, wherein the plurality of transverse compliant members of the first and second external electrodes are defined by the plurality of openings.

15. The piezoelectric actuator as in claim 11, wherein the first and second external electrodes are formed from the sheet of conductive material and the plurality of complaint members are defined by a plurality of openings along a center line of the sheet of conductive material, wherein the plurality of openings are spaced apart from each other along the center line wherein a portion of each of the plurality of openings is located on one side of the center line and another portion of each of the plurality of openings is located on the other side of the center line.

16. The piezoelectric actuator as in claim 15, wherein the upper layer and the lower layer of the first and second external electrodes are defined by portions of the sheet of conductive material stacked to one side of the plurality of openings.

17. The piezoelectric actuator as in claim 11, wherein the plurality of transverse compliant members are defined by a plurality of openings.

18. The piezoelectric actuator as in claim 11, wherein the first and second external electrodes are each connected to by a first electrical conductor and a second electrical conductor respectively, each conductor connected at one end of each electrode and each electrode has a rectangular shape.

19. The piezoelectric actuator as in claim 18, wherein the first and second external electrodes are formed from a sheet of conductive material and the width of the sheet of conductive material is substantially shorter than a length of the sheet of the conductive material.

20. A method for manufacturing a strain tolerant electrode, the method comprising:

cutting a plurality of slots within a sheet of conductive material;

folding the sheet of conductive material upon itself to define an upper layer and a lower layer underling the upper layer and configured for making bonded electrical contact with a stack of piezoceramic layers, wherein the plurality of slots define a plurality of transverse compliant members each of which providing electrical communication between the upper layer and the lower layer and wherein a surface of the upper layer is in direct interfacial electrical contact with a surface of the lower layer after the sheet of conductive material is folded upon itself, wherein any cracks in the lower layer are bridged by the plurality of transverse compliant members and/or the direct interfacial electrical contact between the surface of the lower layer and the surface of the upper layer since expansion and contraction of the lower layer is possible without resulting expansion and contraction of the upper layer.

21. The method as in claim 20, wherein a first portion of the plurality of slots overlies a second portion of the plurality of slots and the upper layer and the lower layer are defined by portions of the sheet of conductive material disposed about opposite sides of the plurality of slots.

22. A strain tolerant electrode formed by the method of claim 20.

23. The method as in claim 20, wherein the plurality of slots are located along a center line of the sheet of conductive material, wherein the plurality of slots are spaced apart from each other along the center line wherein a portion of each of the plurality of slots is located on one side of the center line and another portion of each of the plurality of slots is located on the other side of the center line.

24. A strain tolerant electrode, comprising:

an upper layer;

a lower layer underlying the upper layer and configured for making bonded electrical contact with a stack of piezoceramic layers, wherein the upper layer and the lower layer are regions of a sheet of conductive material;

a plurality of transverse compliant members providing electrical communication between the upper layer and the lower layer through an electrical path between the upper layer and the lower layer, wherein the upper layer and the lower layer are not in direct interfacial electrical contact such that the electrical path between the upper layer and the lower layer is provided only by the plurality of transverse compliant members such that actuator expansion and contraction of the lower layer is possible without resulting expansion and contraction of the upper layer.

* * * * *